United States Patent
Chen et al.

(10) Patent No.: US 6,292,389 B1
(45) Date of Patent: Sep. 18, 2001

(54) MAGNETIC ELEMENT WITH IMPROVED FIELD RESPONSE AND FABRICATING METHOD THEREOF

(75) Inventors: Eugene Youjun Chen, Gilbert; Jon Michael Slaughter, Tempe, both of AZ (US); Jing Shi, Salt Lake City, UT (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/356,864

(22) Filed: Jul. 19, 1999

(51) Int. Cl.[7] .............................. H01L 29/76; G11C 11/14
(52) U.S. Cl. .................. 365/158; 365/171; 365/173; 257/295
(58) Field of Search .......................... 257/295; 365/171, 365/173, 158

(56) References Cited

U.S. PATENT DOCUMENTS 5,764,567 * 6/1998 Parkin .................................. 365/173

FOREIGN PATENT DOCUMENTS 1000422  1/1998 (JP) .

OTHER PUBLICATIONS

"Topological coupling in spin valve type multilayers," Zhang et al., IEEE Transactions on Magnetics, vol. 32, No. 5, Sep. 1996, pp. 4630–4635.

"Spin dependent tunnel/spin–valve devices with different pinning structures made by photolithography," Wang et al, Journal of Applied Physics, Bo. 85, No. 8, Apr. 1999, pp. 5255–5257.

* cited by examiner

Primary Examiner—Minh Loan Tran
(74) Attorney, Agent, or Firm—William E. Koch

(57) ABSTRACT

An improved and novel fabrication method for a magnetic element, and more particularly a magnetic element (10) including a first electrode (14), a second electrode (18) and a spacer layer (16). The first electrode (14) includes a fixed ferromagnetic layer (26) having a thickness $t_1$. A second electrode (18) is included and comprises a free ferromagnetic layer (28) having a thickness $t_2$. A spacer layer (16) is located between the fixed ferromagnetic layer (26) and the free ferromagnetic (28) layer, the spacer layer (16) having a thickness $t_3$, where $0.25t_3 < t_1 < 2t_3$, thereby producing near zero magnetic field at the free ferromagnetic layer (28).

18 Claims, 3 Drawing Sheets

MAGNETIC ELEMENT WITH IMPROVED FIELD RESPONSE AND FABRICATING METHOD THEREOF

FIELD OF THE INVENTION

The present invention relates to magnetic elements for information storage and/or sensing and a fabricating method thereof, and more particularly, to a method of fabricating and thus defining the magnetic element to improve magnetic field response.

BACKGROUND OF THE INVENTION

This application is related to a co-pending application that bears U.S. Pat. No. 5,940,319, entitled "MAGNETIC RANDOM ACCESS MEMORY AND FABRICATING METHOD THEREOF," filed on Aug. 31, 1998, assigned to the same assignee and incorporated herein by this reference, co-pending application that bears U.S. Pat. No. 6,024,885, entitled "PROCESS OF PATTERNING MAGNETIC FILMS" filed on Dec. 8, 1997, assigned to the same assignee and incorporated herein by this reference and issued U.S. Pat. No. 5,768,181, entitled "MAGNETIC DEVICE HAVING MULTI-LAYER WITH INSULATING AND CONDUCTIVE LAYERS", issued Jun. 16, 1998, assigned to the same assignee and incorporated herein by this reference.

Typically, a magnetic element, such as a magnetic memory element, has a structure that includes ferromagnetic layers separated by a non-magnetic layer. Information is stored as directions of magnetization vectors in magnetic layers. Magnetic vectors in one magnetic layer, for instance, are magnetically fixed or pinned, while the magnetization direction of the other magnetic layer is free to switch between the same and opposite directions that are called "Parallel" and "Antiparallel" states, respectively. In response to Parallel and Antiparallel states, the magnetic memory element represents two different resistances. The resistance has minimum and maximum values when the magnetization vectors of the two magnetic layers point in substantially the same and opposite directions, respectively. Accordingly, a detection of changes in resistance allows a device, such as an MRAM device, to provide information stored in the magnetic memory element. The difference between the minimum and maximum resistance values, divided by the minimum resistance is known as the magnetoresistance ratio (MR).

An MRAM device integrates magnetic elements, more particularly magnetic memory elements, and other circuits, for example, a control circuit for magnetic memory elements, comparators for detecting states in a magnetic memory element, input/output circuits, etc. These circuits are fabricated in the process of CMOS (complementary metal-oxide semiconductor) technology in order to lower the power consumption of the device.

In addition, magnetic elements structurally include very thin layers, some of which are tens of angstroms thick. The performance of the magnetic element is sensitive to the surface conditions on which the magnetic layers are deposited. Accordingly, it is necessary to make a flat surface to prevent the characteristics of a magnetic element from degrading.

During typical magnetic element fabrication, such as MRAM element fabrication, which includes metal films grown by sputter deposition, evaporation, or epitaxy techniques, the film surfaces are not absolutely flat but instead exhibit surface or interface waviness. This waviness of the surfaces and/or interfaces of the ferromagnetic layers is the cause of magnetic coupling between the free ferromagnetic layer and the other ferromagnetic layers, such as the fixed layer or pinned layer, which is known as topological coupling or Néel's orange peel coupling. Such coupling is typically undesirable in magnetic elements because it creates an offset in the response of the free layer to an external magnetic field.

The ferromagnetic coupling strength is proportional to surface magnetic charge density and is defined as the inverse of an exponential of the interlayer thickness. As disclosed in U.S. Pat. No. 5,764,567, issued Jun. 9, 1998, and entitled "MAGNETIC TUNNEL JUNCTION DEVICE WITH NONFERROMAGNETIC INTERFACE LAYER FOR IMPROVED MAGNETIC FIELD RESPONSE", by adding a non-magnetic copper layer next to the aluminum oxide tunnel barrier in a magnetic tunnel junction structure, hence increasing the separation between the magnetic layers, reduced ferromagnetic orange peel coupling, or topological coupling, is achieved. However, the addition of the copper layer will lower the MR of the tunnel junction, and thus degrade device performance. In addition, the inclusion of the copper layer will increase the complexity for etching the material.

Accordingly, it is a purpose of the present invention to provide an improved magnetic element with improved field response.

It is another purpose of the present invention to provide an improved magnetic element that includes reduced ferromagnetic coupling, more particularly ferromagnetic coupling of topological origin.

It is a still further purpose of the present invention to provide a method of forming a magnetic element with improved field response.

It is still a further purpose of the present invention to provide a method of forming a magnetic element with improved field response which is amenable to high throughput manufacturing.

SUMMARY OF THE INVENTION

These needs and others are substantially met through provision of a magnetic element including a first electrode, a second electrode and a spacer layer. The first electrode includes a fixed ferromagnetic layer whose magnetization is fixed in a preferred direction in the presence of an applied magnetic field, the fixed ferromagnetic layer having a thickness $t_1$. A second electrode is included and comprises a free ferromagnetic layer whose magnetization is free to rotate in the presence of an applied magnetic field, the free ferromagnetic layer having a thickness $t_2$. A spacer layer is located between the fixed ferromagnetic layer of the first electrode and the free ferromagnetic layer of the second electrode for permitting tunneling current in a direction generally perpendicular to the fixed and free ferromagnetic layers, the spacer layer having a thickness $t_3$, where $0.25 t_3 < t_1 < 2 t_3$, such that the net magnetic field at the interface between the free layer and the spacer layer, due to the topology of the other ferromagnetic surfaces, is near zero. The magnetic element further includes a metal lead and a substrate, the metal lead, the first and second electrodes and the spacer layer being formed on the substrate. Additionally disclosed is a method of fabricating the magnetic element with improved field response.

DETAILED DESCRIPTION OF THE PREFERRED EMBODIMENTS

Figure 1:
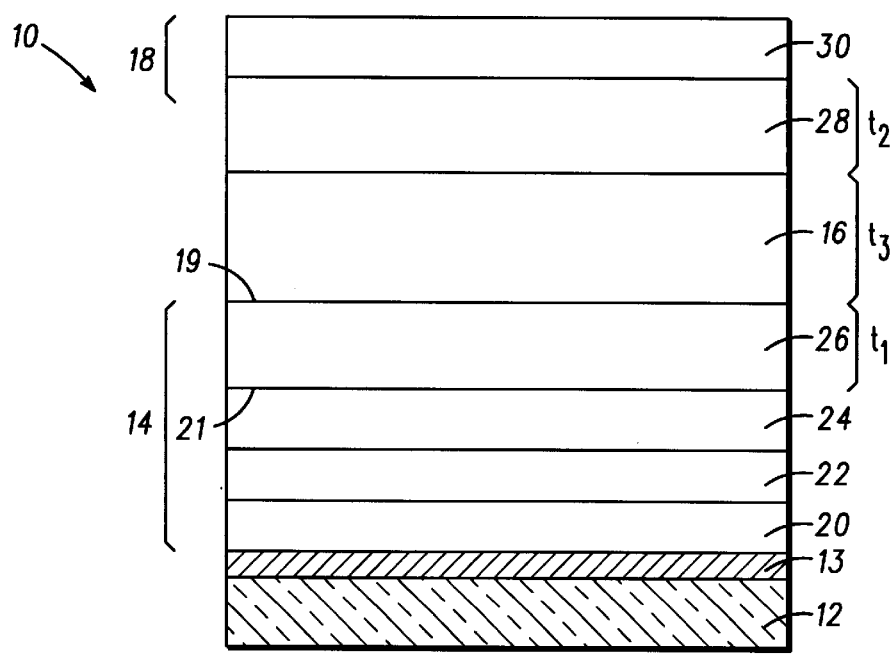
FIGS. 1 and 2 show cross-sectional views of a magnetic element with improved field response according to the present invention.
Figure 2:
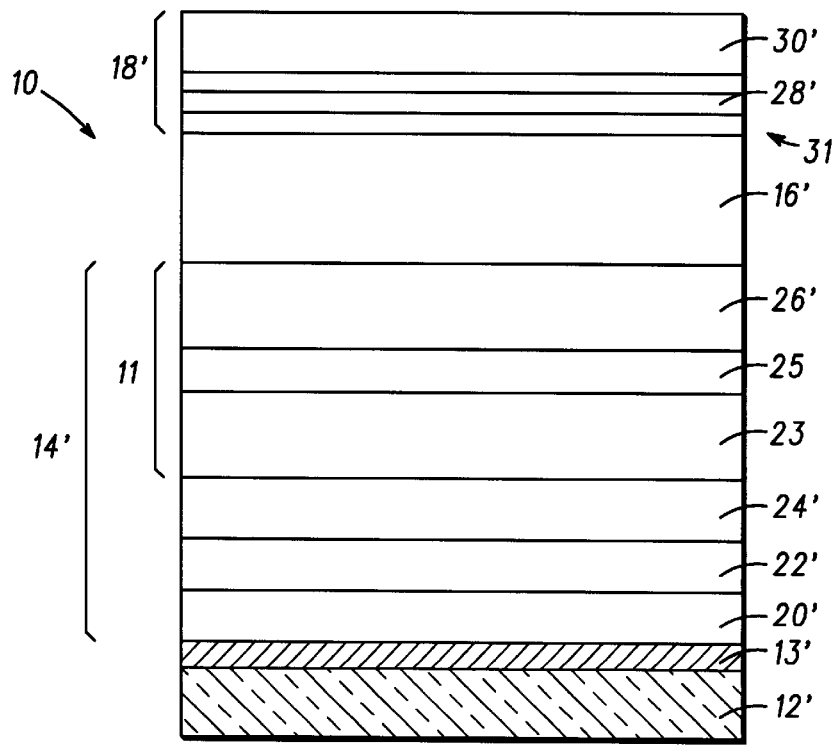

During the course of this description, like numbers are used to identify like elements according to the different figures that illustrate the invention. FIGS. 1 and 2 illustrate in cross-sectional views a magnetic element according to the present invention. More particularly, illustrated in FIG.1, is a fully patterned magnetic element structure 10. The structure includes a substrate 12, a base electrode multilayer stack 14, a spacer layer 16 including oxidized aluminum, and a top electrode multilayer stack 18. It is additionally disclosed that spacer layer 16 includes either a dielectric material defining a MTJ structure or a conductive material defining a spin valve structure. Base electrode multilayer stack 14 and top electrode multilayer stack 18 include ferromagnetic layers. Base electrode layers 14 are formed on a metal lead 13, which is formed on a substrate 12. Base electrode layers 14 include a first seed layer 20, deposited on metal lead 13, a template layer 22, a layer of antiferromagnetic pinning material 24, and a fixed ferromagnetic layer 26 formed on and exchange coupled with the underlying antiferromagnetic pinning layer 24.

Ferromagnetic layer 26 is described as fixed, or pinned, in that its magnetic moment is prevented from rotation in the presence of an applied magnetic field. Ferromagnetic layer 26 is typically formed of alloys of one or more of the following: nickel (Ni), iron (Fe), and cobalt (Co) and includes a top surface 19 and a bottom surface 21. Top electrode stack 18 includes a free ferromagnetic layer 28 and a protective layer 30. The magnetic moment of the free ferromagnetic layer 24 is not fixed, or pinned, by exchange coupling, and is free to rotate in the presence of an applied magnetic field. Free ferromagnetic layer 28 is typically formed of alloys of one or more of the following: nickel (Ni), iron (Fe) and cobalt (Co). Fixed ferromagnetic layer 26 is described as having a thickness of $t_1$, wherein $t_1$ is typically within a range of 5–40 Å. Free ferromagnetic layer 28 is described as having a thickness of $t_2$, wherein t2 is generally less than 50 Å. Spacer layer 16 is described as having a thickness of $t_3$, wherein t3 is generally less than 20 Å for magnetic tunnel junction structures or less than 40 Å for spin valve structures or the like. During fabrication, $t_1$ is chosen such that the magnetic fields produced by the topology of top surface 19 and bottom surface 21 of fixed ferromagnetic layer 26 cancel to produce near zero coupling energy between free ferromagnetic layer 28 and fixed ferromagnetic layer 26. It should be understood that a reversed, or flipped, structure is anticipated by this disclosure. More particularly, it is anticipated that the disclosed magnetic element can be formed to include a top fixed, or pinned layer, and thus described as a top pinned structure.

Illustrated in FIG.2, is an alternative embodiment of a fully patterned magnetic element structure, referenced 10', including a synthetic antiferromagnetic structure 11. Again, it should be noted that all components of the first embodiment that are similar to components of the second embodiment, are designated with similar numbers, having a prime added to indicate the different embodiment. Similar to the structure described with regard to FIG. 1, this structure includes a substrate 12', a base electrode multilayer stack 14', a spacer layer 16', and a top electrode multilayer stack 18'. Base electrode multilayer stack 14' and top electrode multilayer stack 18' include ferromagnetic layers, generally similar to stack 14 and 18 of FIG. 1. Base electrode layers 14' are formed on a metal lead 13', which is formed on a substrate 12' and includes a first seed layer 20', deposited on metal lead 13', a template layer 22', a layer of antiferromagnetic material 24', a pinned ferromagnetic layer 23 formed on and exchange coupled with the underlying antiferromagnetic layer 24', a coupling layer 25, and a fixed ferromagnetic layer 26' which is antiferromagnetically coupled to the pinned layer. Ferromagnetic layer 23 and 26' are described as fixed, or pinned, in that their magnetic moment is prevented from rotation in the presence of an applied magnetic field. Top electrode stack 18 includes a free ferromagnetic layer 28' and a protective layer 30'. The magnetic moment of the free ferromagnetic layer 28' is not fixed, or pinned, by exchange coupling, and is free to rotate in the presence of an applied magnetic field. It is disclosed that free ferromagnetic layer 28', includes a Ru antiferromagnetically coupled trilayer 31 as illustrated in FIG. 2.

Fixed ferromagnetic layer 26' is described as having a thickness of $t_1$. Free ferromagnetic layer 28' is described as having a thickness of $t_2$. Spacer layer 16' is described as having a thickness of $t_3$. It should be understood that a reversed, or flipped, structure is anticipated by this disclosure. More particularly, it is anticipated that the disclosed magnetic element with SAF structure can be formed to include a top fixed, or pinned layer, and thus described as a top pinned structure.

Figure 3:
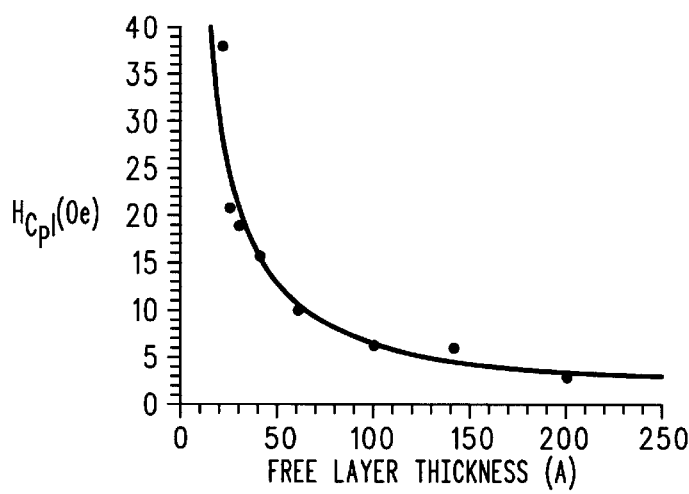
FIGS. 3–5 illustrate the coupling field with respect to thickness of the metal film layers.

Referring now to FIG. 3, a diagrammatic illustration is provided showing the effect of the thickness of the free ferromagnetic layer, such as layer 28 of FIG. 1, and the relative coupling field of the magnetic element. Magnetic elements typically utilized in information storage and/or sensing devices necessitate the use of thin free layers to maintain low switching fields. Yet, as illustrated in FIG. 3, when designing devices with these thin free layers, the coupling field $H_{cpl}$ is increased. The coupling field as illustrated increases as $1/d_{free}$ where d is the thickness of the free layer such as 28 or 28'. Accordingly, to lower the coupling field $H_{cpl}$, adjustments can be made in the remaining structure of the magnetic element as disclosed herein.

Figure 4:
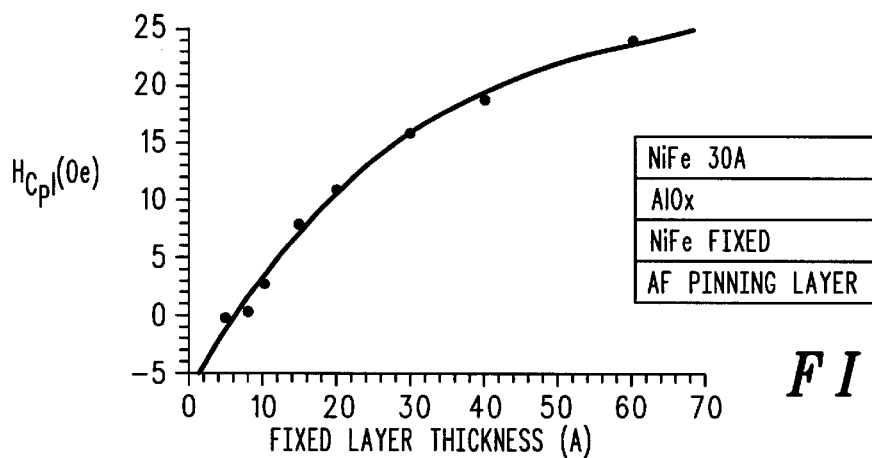
Figure 5:
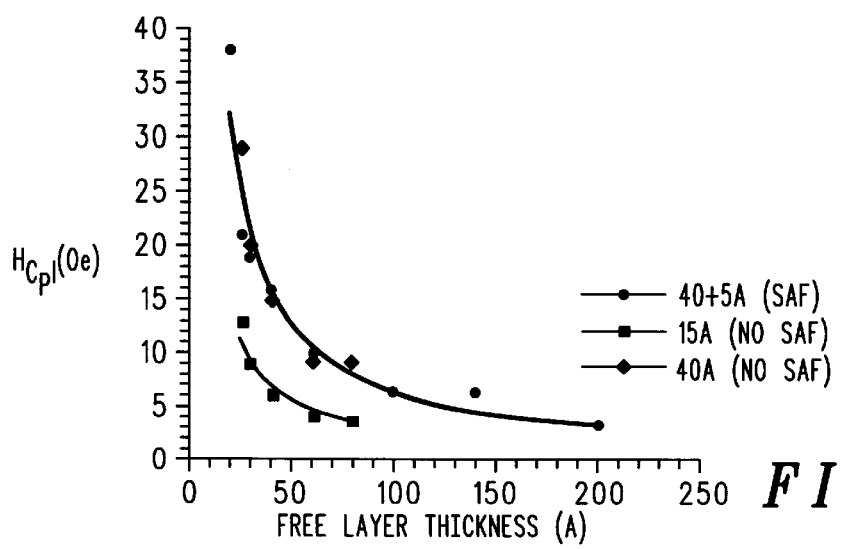

Referring to FIG. 4, illustrated is the reduction in the coupling field $H_{cpl}$ by adjusting the thickness of the fixed layer, such as layer 26 of FIG. 1. As illustrated, by decreasing the thickness of the fixed layer, the coupling field $H_{cpl}$ is decreased, approaching near zero. Accordingly, and as illustrated in FIG. 5, a magnetic element, generally similar to magnetic element 10 of FIG. 1, having included in addition to free layer 18, a fixed layer having a thickness of 15 Å will provide for a dramatic lowering shift in the Hcpl curve, hence the ability to achieve near zero coupling.

Figure 6:
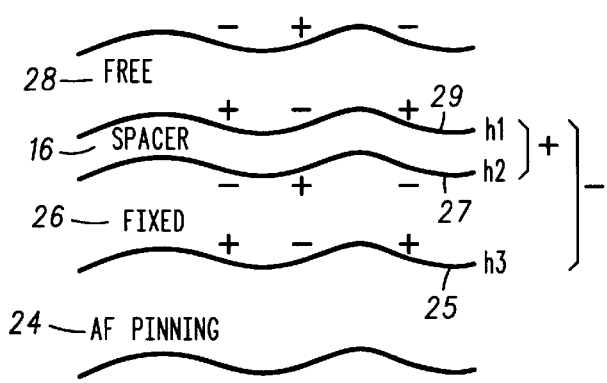
FIG. 6 illustrates the creation of magnetic poles by forming interface roughness.

In addition, as illustrated in FIG. 6, by adjusting the roughness of the interface of the pinning layer in a structure such as that disclosed as magnetic element 10 of FIG. 1, a decrease in the magnetic field response coupling can be achieved. Referring more specifically to FIG. 6, h3 is the waviness amplitude of an interface surface 25 of AF pinning layer 24 most remote from free layer 28, h2 is the waviness amplitude of an interface surface 27 of fixed ferromagnetic layer 26, closest to free ferromagnetic layer 28, and h1 is the waviness amplitude of an interface surface 29 of spacer layer 16, closest to free ferromagnetic layer 28. Magnetic poles are created by the interface roughness, hn, with period λ. Interface surface 27 of fixed layer 26 couples positively to interface surface 29 of free layer 28. Interface surface 25 of AF pinning layer 24 couples negatively to interface surface 29 of free layer 28. The Hcpl depends on h3/h2, the thickness of fixed layer 26 and the λ. By increasing the roughness of h3 so that h3>h2, near zero coupling can be further achieved in magnetic element 10. More specifically, when h3>h2, there will be one point with respect to the thickness of fixed layer 26, where the field response coupling will exactly cancel the magneto-static coupling which is zero at $d_{fixed}=0$.

The roughness of interface 25, or h3, can be adjusted by increasing or decreasing the thickness of pinning material 24, ion bombardment, or deposition of a third material. More specifically, the roughness of pinning material 24 can be increased or decreased by making pinning material 24 thinner or thicker, wherein, fixed layer 26 must "heal" the roughness to result in h3>h2. Typically nickel iron (NiFe) will result in proper "healing" to result in h3>h2. Utilizing an alternative method to adjust the roughness of interface surface 25, ion bombardment is utilized to either roughen pinning material 24 or smooth surface 27 of pinned material 26. Finally, the adjustment of roughness can be achieved by depositing a small amount of a third material between pinning layer 24 and fixed layer 26 to increase h3, particularly if the material grows with an island-like structure.

Next, it is disclosed that the use of non-magnetic seed and template layers (20 and 22) will result in a decrease in the magnetic field response coupling without the need for the inclusion of a SAF structure. The template layer will add no moment to the structure, thus the only magneto-static coupling is a result of the thin pinned layer included within the structure. Accordingly, adjustments can be made for the canceling of the level of coupling to achieve near zero coupling. When template layer 22 is nonmagnetic, and there is no SAF, negative magnetostatic coupling due to poles at the ends of the patterned shape and positive Neel coupling controlled by the thickness of pinned layer 24. The thickness of pinned layer 24 could be chosen to offset the magneto-static coupling giving a centered loop.

Finally, it is disclosed to include a high moment alloy, such as Ni(50%)Fe(50%) on at least one side of fixed ferromagnetic layer 26 to increase the negative coupling contribution to the total coupling effect.

Figure 7:
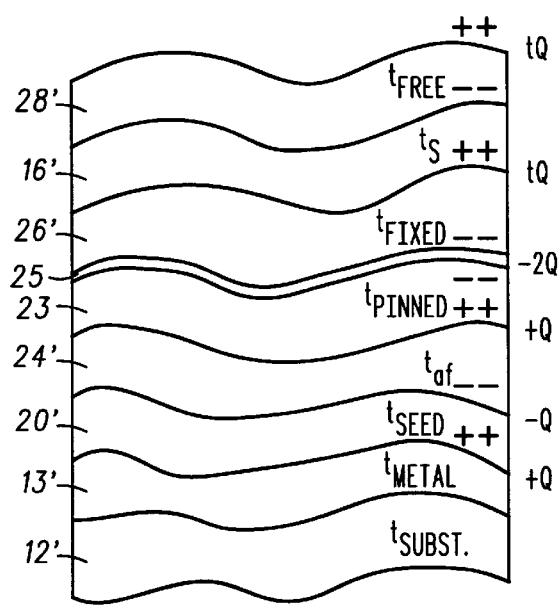
FIG. 7 illustrates the magnetic poles created by adjusting the interface roughness of the metal film layers of the magnetic element according to the present invention.

Referring now to FIG. 7, illustrated is the structure of magnetic element 10' of FIG. 2 showing the magnetic poles created. During operation of magnetic element 10' as disclosed herein, when the total magnetic field from the poles at the interfaces other than the one at the origin of the y axis is near zero, then the topological coupling will be near zero. When the total field at the y axis origin is negative, then the topological coupling will be negative or antiferromagnetic in nature. Usually the total field at the y axis origin where the free magnetic layer lies is positive, thus causing ferromagnetic topological coupling. However, for the structure shown in FIG. 7, for certain conditions, particularly when the fixed layer thickness is thin, topological coupling can be zero or even negative.

Figure 8:
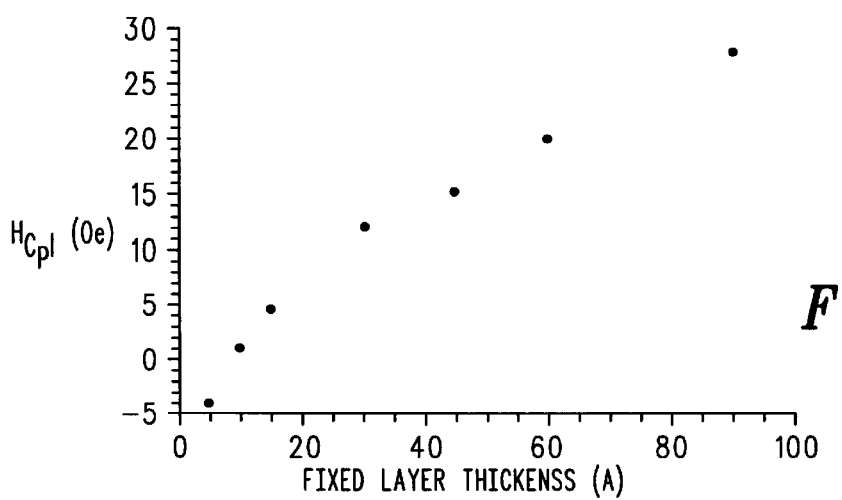
FIG. 8 illustrates the experimental results of the topological coupling field versus the fixed magnetic layer thickness according to the present invention.

The additional interface will produce an even stronger cancellation of the coupling from interface 27 than could be accomplished by interface 25 alone. Experimental results of the topological coupling field versus the fixed magnetic layer thickness are shown in FIG. 8. As the fixed magnetic layer thickness decreases in the magnetic tunnel junction structure, the coupling field decreases, crosses zero, and finally becomes negative. Overall the layers in magnetic memory element 10 are very thin with magnetic layers varying from 3 to 200 Å.

Thus, a magnetic element with an improved field response and its fabrication method are disclosed in which the magnetic coupling is adjusted based on the thickness of the fixed ferromagnetic layer, and/or roughness of the interface surface of the fixed ferromagnetic layer relative to the remaining metal thin film structure. As disclosed, this technique can be applied to devices using patterned magnetic elements, such as magnetic sensors, magnetic recording heads, magnetic recording media, or the like. Accordingly, such instances are intended to be covered by this disclosure

What is claimed is:

1. A magnetic element comprising:
    a first electrode comprising a fixed ferromagnetic layer having a top surface and a bottom surface whose magnetization is fixed in a preferred direction in the presence of an applied magnetic field, the fixed ferromagnetic layer having a thickness $t_1$;
    a second electrode comprising a free ferromagnetic layer having a surface whose magnetization is free to rotate in the presence of an applied magnetic field, the free ferromagnetic layer having a thickness $t_2$;
    a spacer layer located between the fixed ferromagnetic layer of the first electrode and the free ferromagnetic layer of the second electrode, the spacer layer having a thickness $t_3$;
    wherein $t_1$ is chosen such that the magnetic fields produced by the topology of the top surface and the bottom surface of the fixed ferromagnetic layer cancel to produce near zero coupling energy between the free ferromagnetic layer and the fixed magnetic layer; and
    a substrate, the first and second electrodes, and the spacer layer, being formed on the substrate.

2. A magnetic element as claimed in claim 1 wherein $t_1$ is chosen in the range, $0.25t_3<t_1<2t_3$, such that the magnetic fields produced by the topology of the surfaces of the fixed ferromagnetic layer cancel to produce the lowest coupling energy possible between the free ferromagnetic layer and the fixed ferromagnetic layers without degradation of the electrical properties of the device.

3. A magnetic element as claimed in claim 1 wherein the first electrode further comprises a pinned ferromagnetic layer and an antiferromagnetic pinning layer exchange coupled thereto, the pinned ferromagnetic layer and the antiferromagnetic pinning layer formed between the substrate and the fixed ferromagnetic layer, the pinned ferromagnetic layer having its magnetization fixed by antiferromagnetic exchange though a spacer layer, in a direction opposite the fixed ferromagnetic layer and thereby defining a SAF structure.

4. A magnetic element as claimed in claim 1 wherein the magnetization directions of the fixed and the free ferromagnetic layers are one of parallel or antiparallel to one another in the absence of an applied magnetic field.

5. A magnetic element as claimed in claim 1 wherein the free ferromagnetic layer and the fixed ferromagnetic layer include at least one of NiFe, NiFeCo, CoFe, or Co.

6. A magnetic element as claimed in claim 1 wherein the spacer layer includes one of a dielectric material defining a MTJ structure or a conductive material defining a spin valve structure.

7. A magnetic element as claimed in claim 1 further including a high moment material located at an interface of the fixed ferromagnetic layer and the spacer layer.

8. A magnetic element as claimed in claim 1 wherein the fixed ferromagnetic layer is a high moment material.

9. A magnetic element as claimed in claim 1 wherein the free ferromagnetic layer includes an Ru antiferromagnetically coupled tri-layer.

10. A magnetic element as claimed in claim 1 wherein the spacer layer has a thickness of less than 20 Å.

11. A magnetic element comprising:

a fixed ferromagnetic layer including a top surface and a bottom surface whose magnetic moment is fixed in a preferred direction in the presence of an applied magnetic field, the fixed ferromagnetic layer having a thickness of $t_1$;

a free ferromagnetic layer whose magnetic moment is oriented generally perpendicular to the moment of the magnetic field and is free to rotate away from said perpendicular orientation in the presence of an applied magnetic field, the free ferromagnetic layer having a thickness of $t_2$; and a spacer layer located between the fixed ferromagnetic layer and the free ferromagnetic, the spacer layer having a thickness of $t_3$;

wherein $t_1$ is chosen such that the magnetic fields produced by the topology of the top surface and the bottom surface of the fixed ferromagnetic layer cancel to produce near zero coupling energy between the free ferromagnetic layer and the fixed ferromagnetic layer.

12. A magnetic element as claimed in claim 11 wherein $0.25t_3 < t_1 < 2t_3$.

13. A magnetic element as claimed in claim 11 further including a high moment material located at an interface of the fixed ferromagnetic layer.

14. A magnetic element as claimed in claim 11 wherein the fixed ferromagnetic layer is a high moment material.

15. A magnetic element as claimed in claim 11 wherein the free ferromagnetic layer includes an Ru antiferromagnetically coupled tri-layer.

16. A magnetic element as claimed in claim 11 wherein t3 has a thickness of less than 20 Å.

17. A magnetic element as claimed in claim 11 wherein the spacer layer includes one of a dielectric material defining a MTJ structure or a conductive material defining a spin valve structure.

18. A magnetic element as claimed in claim 11 including an AF pinning layer formed adjacent the fixed ferromagnetic layer, wherein the roughness of an interface h3 of the AF pinning layer, is greater than the roughness of an interface h2 of the fixed ferromagnetic layer, thereby decreasing the coupling field of the magnetic element.

* * * * *

UNITED STATES PATENT AND TRADEMARK OFFICE
CERTIFICATE OF CORRECTION

PATENT NO.    : 6,292,389 B1
DATED         : September 18, 2001
INVENTOR(S)   : Chen et al.

It is certified that error appears in the above-identified patent and that said Letters Patent is hereby corrected as shown below:

<u>Column 1,</u>
Line 4, after the Title, please add as a new first paragraph the following paragraph:

-- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*